| (12) | United States Patent | (10) Patent No.: | US 10,103,325 B2 |
|---|---|---|---|
| | Chen | (45) Date of Patent: | Oct. 16, 2018 |

(54) RESISTANCE CHANGE MEMORY DEVICE AND FABRICATION METHOD THEREOF

(71) Applicant: Winbond Electronics Corp., Taichung (TW)

(72) Inventor: Frederick Chen, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/379,505

(22) Filed: Dec. 15, 2016

(65) Prior Publication Data

US 2018/0175289 A1  Jun. 21, 2018

(51) Int. Cl.
*H01L 45/00* (2006.01)
*H01L 47/00* (2006.01)
*H01L 21/3205* (2006.01)
*G11C 13/00* (2006.01)
*G11C 11/00* (2006.01)

(52) U.S. Cl.
CPC ............ *H01L 45/06* (2013.01); *G11C 11/005* (2013.01); *G11C 13/003* (2013.01); *G11C 13/0004* (2013.01); *G11C 13/0035* (2013.01); *H01L 45/144* (2013.01); *H01L 45/1608* (2013.01)

(58) Field of Classification Search
CPC ... H01L 45/06; H01L 45/144; H01L 45/1608; G11C 13/003; G11C 13/0004
USPC ....... 257/2, 3, 4, 5, 295, 421, 489, E21.004, 257/E27.004, E27.006, E27.008, E31.029, 257/E45.002, E47.001; 365/148, 163, 365/185.03; 438/95, 97, 483
See application file for complete search history.

(56) References Cited

U.S. PATENT DOCUMENTS

| 7,254,059 | B2 * | 8/2007 | Li | ............................. G11C 11/56 257/E45.002 |
| 7,767,568 | B2 * | 8/2010 | An | ....................... H01L 27/2409 257/4 |
| 8,476,614 | B2 * | 7/2013 | Sumino | .................. H01L 45/145 257/2 |
| 8,710,580 | B2 | 4/2014 | Sakuma et al. | |
| 9,231,202 | B2 | 1/2016 | Pangal et al. | |
| 9,318,699 | B2 | 4/2016 | Pellizzer et al. | |
| 9,419,056 | B2 * | 8/2016 | Pellizzer | .................. H01L 45/06 |
| 2008/0068879 | A1 * | 3/2008 | Ahn | ...................... G11C 11/5678 365/163 |
| 2008/0248632 | A1 * | 10/2008 | Youn | .................... H01L 27/2409 438/483 |

(Continued)

OTHER PUBLICATIONS

"Office Action of Taiwan Counterpart Application," dated Apr. 11, 2018, p. 1-p. 6.

*Primary Examiner* — Dao H Nguyen
(74) *Attorney, Agent, or Firm* — JCIPRNET (57) ABSTRACT

The resistance change memory device including a first resistance change memory element, a second resistance change memory element, and a memory controller is provided. The first resistance change memory element is disposed on a chip. The second resistance change memory element is disposed on the same chip. The memory controller is disposed on the same chip. The memory controller is configured to control data access of the first resistance change memory element and the second resistance change memory element. An accessing frequency of the first resistance change memory element is different from an accessing frequency of the second resistance change memory element.

12 Claims, 9 Drawing Sheets

(56) References Cited

U.S. PATENT DOCUMENTS

2011/0242885 A1 10/2011 Kim
2014/0361238 A1 12/2014 Joshi et al.

* cited by examiner

RESISTANCE CHANGE MEMORY DEVICE AND FABRICATION METHOD THEREOF

BACKGROUND OF THE INVENTION

1. Field of the Invention

The invention generally relates to a memory device and a fabrication method thereof, in particular, to a resistance change memory device and a fabrication method thereof.

2. Description of Related Art

The performance of resistance change memory is highly dependent on the composition of the phase change material. Relying on a single composition, such as the originally popular $Ge_2Sb_2Te_5$ (GST), makes the resistance change memory difficult to simultaneously satisfy retention and speed requirements. On the other hand, the recent improvements in the resistance change memory technology and the rise of 3D XPoint™ memory suggests this technology cannot be ignored just yet, and an optimized form may be quite competitive against both dynamic random access memory (DRAM) and NAND flash, mainly due to the enhanced crosspoint density avoiding the processing of small transistors.

SUMMARY OF THE INVENTION

Accordingly, the invention is directed to a high-density crosspoint memory for high-speed and storage functions.

An exemplary embodiment of the invention provides a fabrication method of a resistance change memory device. The fabrication method includes: forming starting layers on a substrate, where the starting layers include a dielectric layer; forming a first resistance change memory stack in the dielectric layer for a first resistance change memory element; and forming a second resistance change memory stack in the dielectric layer for a second resistance change memory element. An accessing frequency of the first resistance change memory element is different from an accessing frequency of the second resistance change memory element.

In an exemplary embodiment of the invention, the accessing frequency of the first resistance change memory element is higher than the accessing frequency of the second resistance change memory element.

In an exemplary embodiment of the invention, the first resistance change memory stack includes a first phase change material, and the second resistance change memory stack includes a second phase change material. The first phase change material is different from the second phase change material.

In an exemplary embodiment of the invention, a crystallization speed of the first phase change material is faster than a crystallization speed of the second phase change material.

In an exemplary embodiment of the invention, the first phase change material is Ge-rich GeSbTe (GST) material, and the second phase change material is a SbTe-based material.

In an exemplary embodiment of the invention, the first resistance change memory element and the second resistance change memory element are on the same chip.

In an exemplary embodiment of the invention, the step of forming the first resistance change memory stack in the dielectric layer for the first resistance change memory element includes: etching an area in the dielectric layer; depositing the first resistance change memory stack to the area; and planarizing the dielectric layer.

In an exemplary embodiment of the invention, the first resistance change memory stack includes a first phase change material layer and a top electrode layer. The step of depositing the first resistance change memory stack to the area includes: sequentially forming the first phase change material layer and the top electrode layer on the dielectric layer.

In an exemplary embodiment of the invention, the step of forming the second resistance change memory stack in the dielectric layer for the second resistance change memory element includes: etching an area in the dielectric layer; depositing the second resistance change memory stack to the area; and planarizing the dielectric layer.

In an exemplary embodiment of the invention, the second resistance change memory stack includes a second phase change material layer and a top electrode layer. The step of depositing the second resistance change memory stack to the area includes: sequentially forming the second phase change material layer and the top electrode layer on the dielectric layer.

In an exemplary embodiment of the invention, the starting layers further include a word line layer, a bottom electrode layer, a switch layer, and a middle electrode layer. The step of forming the starting layers on the substrate includes: sequentially forming the word line layer, the bottom electrode layer, the switch layer, the middle electrode layer, and the dielectric layer on the substrate.

In an exemplary embodiment of the invention, the fabrication method of the resistance change memory device further includes: forming a wording pattern; backfilling a dielectric material to a space between the wording pattern; and planarizing the dielectric layer.

In an exemplary embodiment of the invention, the fabrication method of the resistance change memory device further includes: forming bit line contacts on the substrate, wherein the bit line contacts pass through the starting layers; and forming a bit line pattern on the dielectric layer. The bit line pattern contacts the bit line contacts.

An exemplary embodiment of the invention provides a resistance change memory device. The resistance change memory device includes a first resistance change memory element, a second resistance change memory element, and a memory controller. The first resistance change memory element is disposed on a chip. The second resistance change memory element is disposed on the same chip. The memory controller is disposed on the same chip. The memory controller is configured to control data access of the first resistance change memory element and the second resistance change memory element. An accessing frequency of the first resistance change memory element is different from an accessing frequency of the second resistance change memory element.

In an exemplary embodiment of the invention, the accessing frequency of the first resistance change memory element is higher than the accessing frequency of the second resistance change memory element.

In an exemplary embodiment of the invention, the first resistance change memory element includes a first phase change material, and the second resistance change memory element includes a second phase change material. The first phase change material is different from the second phase change material.

In an exemplary embodiment of the invention, a crystallization speed of the first phase change material is faster than a crystallization speed of the second phase change material.

In an exemplary embodiment of the invention, the first phase change material is a SbTe-based material, which is a fast-crystallizing phase change material while the second phase change material is Ge-rich GeSbTe (GST) material, which is a slow-crystallizing phase change material.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 to FIG. 6 and FIG. 7A to FIG. 11A are cross-sectional views illustrating a fabricating process of a resistance change memory device according to an embodiment of the invention.

FIG. 7B to FIG. 11B are top views illustrating the fabricating process of the resistance change memory device depicted in FIG. 7A to FIG. 11A according to an embodiment of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

For the sake for clarity, sizes and relative sizes of each layer shown in the drawings may be exaggerated.

Resistance change memory's recent developments show substantial progress in reliability and performance improvement. It is evident that choosing composition is a tradeoff between retention and speed. A key emphasis of exemplary embodiments of the invention is to have one part of the resistance change memory used for high-speed operation, where retention is not important, and the other part for storage, not requiring such high speed operation.

The exemplary embodiments of the invention are to use two or even three different resistance change memory compositions for differently weighted memory functions. A phase change material with higher crystallization temperature is more suitable for storage since its high-temperature retention is better, while another phase change material with lower crystallization temperature or higher crystallization speed is better for working memory with low latency, like DRAM.

Additionally, a third type of resistance change memory composition may not even allow crystallization under all expected thermal environments. These compositions still can switch ON by threshold switching but do not retain their ON state after the current is shut off, allowing them to be ideal switches or access devices.

A DRAM-NAND combination (MCP or NVDIMM) may therefore be realized on one chip with the use of cross-point resistance change memory arrays of two different resistance change memory compositions, one for the more volatile memory, one for storage, along with a common third composition for threshold switching, or alternatively, a different crosspoint selector device, e.g., diode, for use as access devices in the crosspoint arrays. The high-speed memory array may be significantly different density from the storage array, e.g., 4-16 Gb vs. 128-512 Gb.

The crosspoint array fabrication for two different resistance change memory compositions would require a particular sequence that could add two masks to the conventional crosspoint array fabrication flow. For better understanding of the invention, at least one exemplary embodiments of the invention are explained below with reference to the figures.

Figure 1:
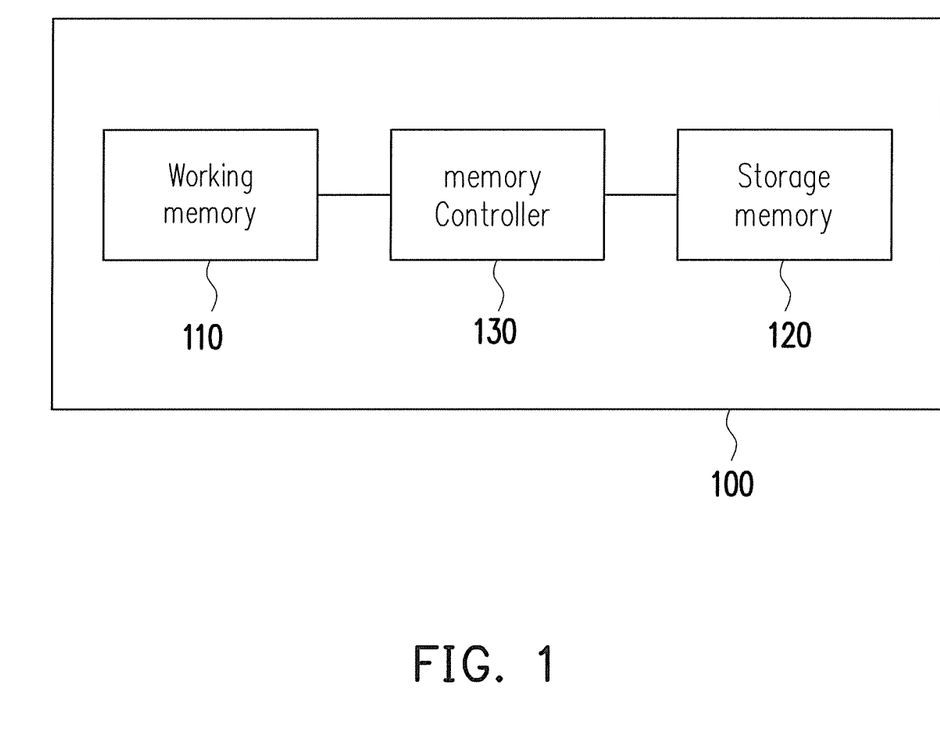
FIG. 1 illustrates a block diagram of a resistance change memory device according to an embodiment of the invention.
Figure 2:
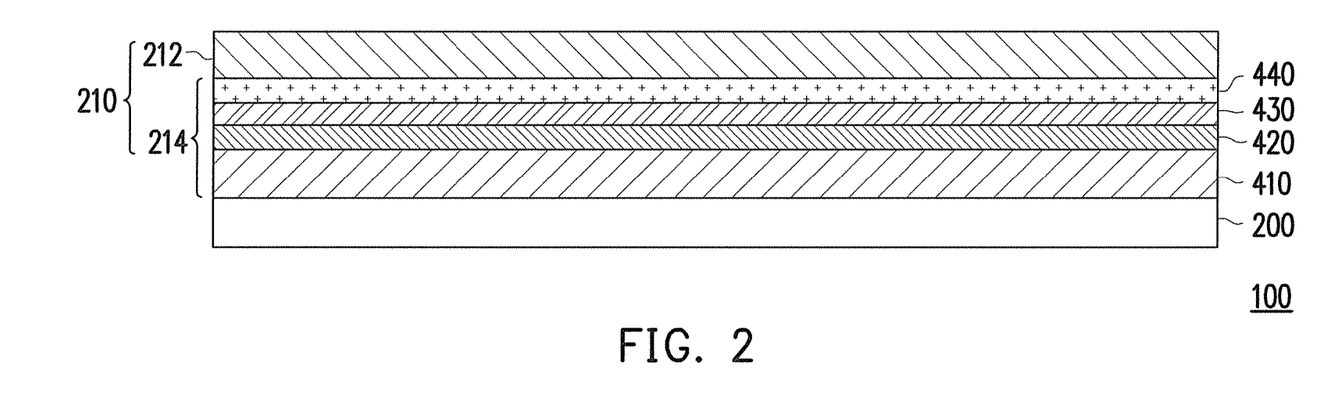

FIG. 1 illustrates a block diagram of a resistance change memory device according to an embodiment of the invention. Referring to FIG. 1, the resistance change memory device 100 of the present embodiment includes a first resistance change memory element 110, a second resistance change memory element 120 and a memory controller 130. In the present embodiment, the memory controller 130 is configured to control data access of the first resistance change memory element 110 and the second resistance change memory element 120. In the present embodiment, the resistance change memory device 100 may be a phase change memory device.

In the present embodiment, the access control of memory may be implemented by using suitable control operations in the related art, which are not particularly limited in the invention. Enough teaching, suggestion, and implementation illustration for access control and embodiments thereof may be obtained with reference to common knowledge in the related art, which is not repeated hereinafter.

In the present embodiment, the first resistance change memory element 110, the second resistance change memory element 120 and the memory controller 130 are disposed on the same chip. In one embodiment, the first resistance change memory element 110 is configured for high-speed operation, e.g. a working memory, and the second resistance change memory element 120 is configured for storage, e.g. a storage memory. Accordingly, the accessing frequency of the first resistance change memory element 110 is higher than the accessing frequency of the second resistance change memory element 120.

In the present embodiment, the first resistance change memory element includes a first phase change material, and the second resistance change memory element includes a second phase change material. In an embodiment, the first phase change material may be a fast-crystallizing SbTe-based phase change material, e.g. 2% N in SbTe and the second phase change material may be a slow-crystallizing Ge-rich GST phase change material, e.g. 5% Ge in SbTe. Accordingly, the crystallization speed of the first phase change material is faster than the crystallization speed of the second phase change material. The phase change materials are not intended to limit the invention.

FIG. 2 to FIG. 6 and FIG. 7A to FIG. 11A are cross-sectional views illustrating a fabricating process of a resistance change memory device according to an embodiment of the invention. FIG. 7B to FIG. 11B are top views illustrating the fabricating process of the resistance change memory device depicted in FIG. 7A to FIG. 11A according to an embodiment of the invention. Referring to FIG. 2 to FIG. 11B, FIG. 2 shows a basic substrate 200 and starting layers 210. In the present embodiment, the starting layers 210 includes a word line layer 410, a bottom electrode layer 420, a switch layer 430, a middle electrode layer 440, and a dielectric layer 212. In the step depicted in FIG. 2, the word line layer 410, the bottom electrode layer 420, the switch layer 430, the middle electrode layer 440, and the dielectric layer 212 are sequentially formed on the substrate 200. Accordingly, the starting layers 210 are formed on the substrate 200. In an embodiment, the layer structure 214 may be p-n junction layers.

Figure 3:
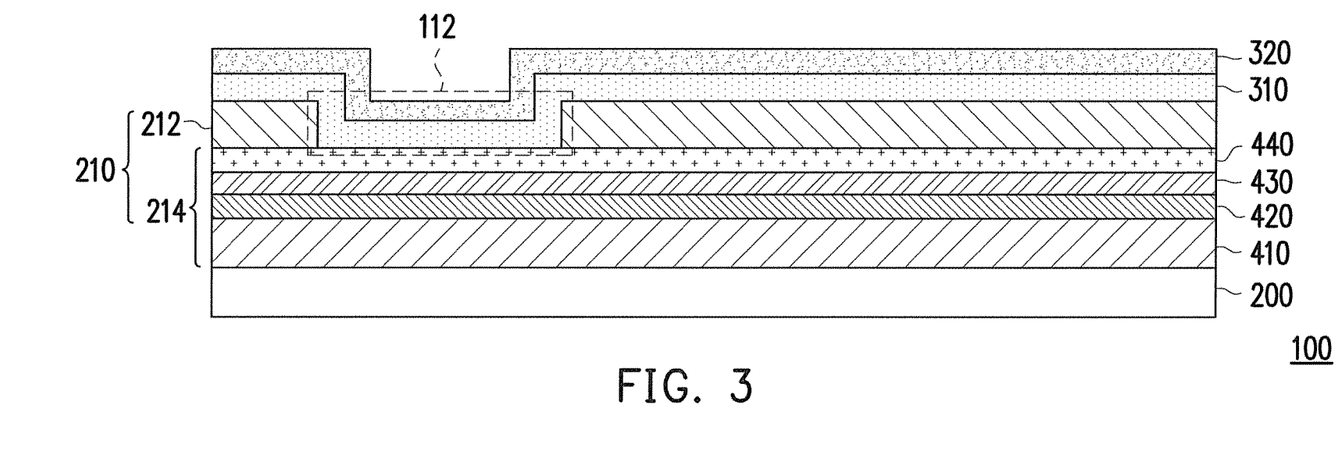
Figure 4:
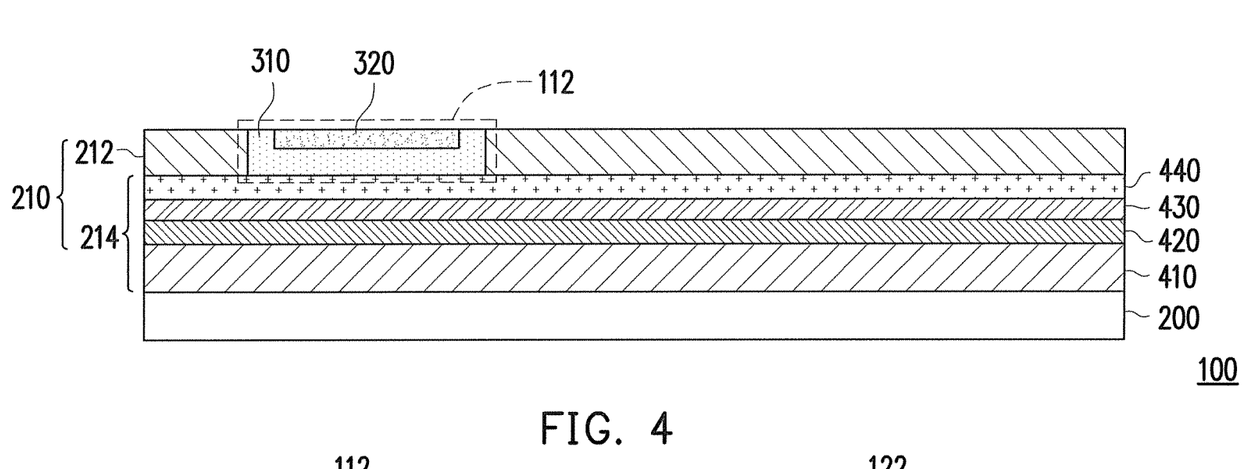

FIG. 3 and FIG. 4 show an etched area for the first memory function block, depositing a resistance change memory stack for the first memory function, and planarization. In FIG. 3 and FIG. 4, an area is etched in the dielectric layer 212, and a first resistance change memory stack 112 is deposited to the etched area. In the present embodiment, the first resistance change memory stack 112 includes a first phase change material layer 310 and a top electrode layer 320. The first phase change material layer 310 and the top electrode layer 320 are sequentially formed on the dielectric layer 212. Next, the first phase change material layer 310 and the top electrode layer 320 outside of the etched area are removed to planarize the dielectric layer 212. The first resistance change memory stack 112 in the dielectric layer 212 are formed for the first resistance change memory element 110.

Figure 5:
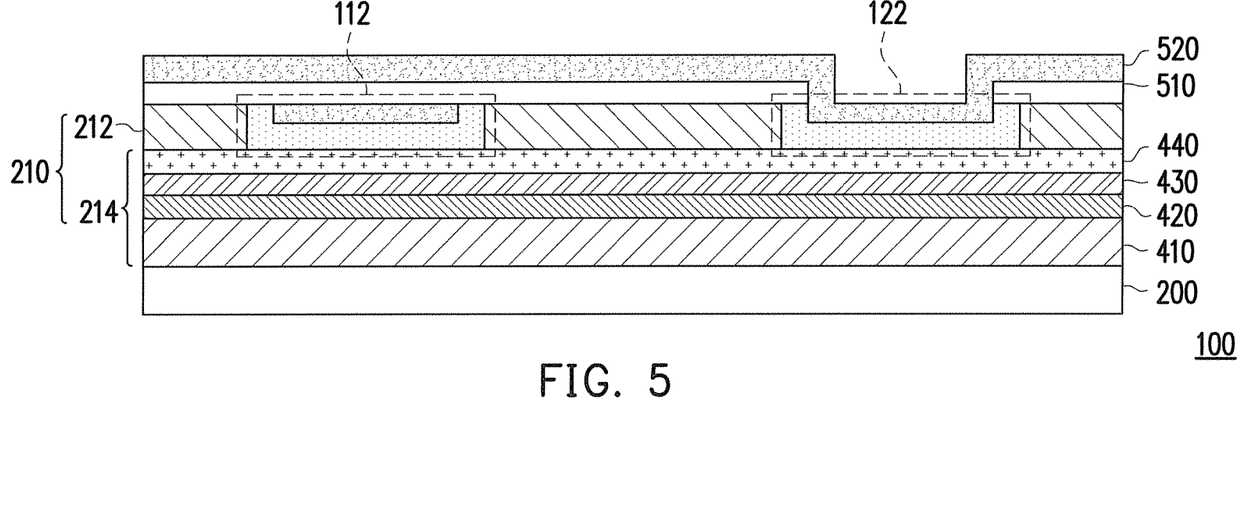
Figure 6:
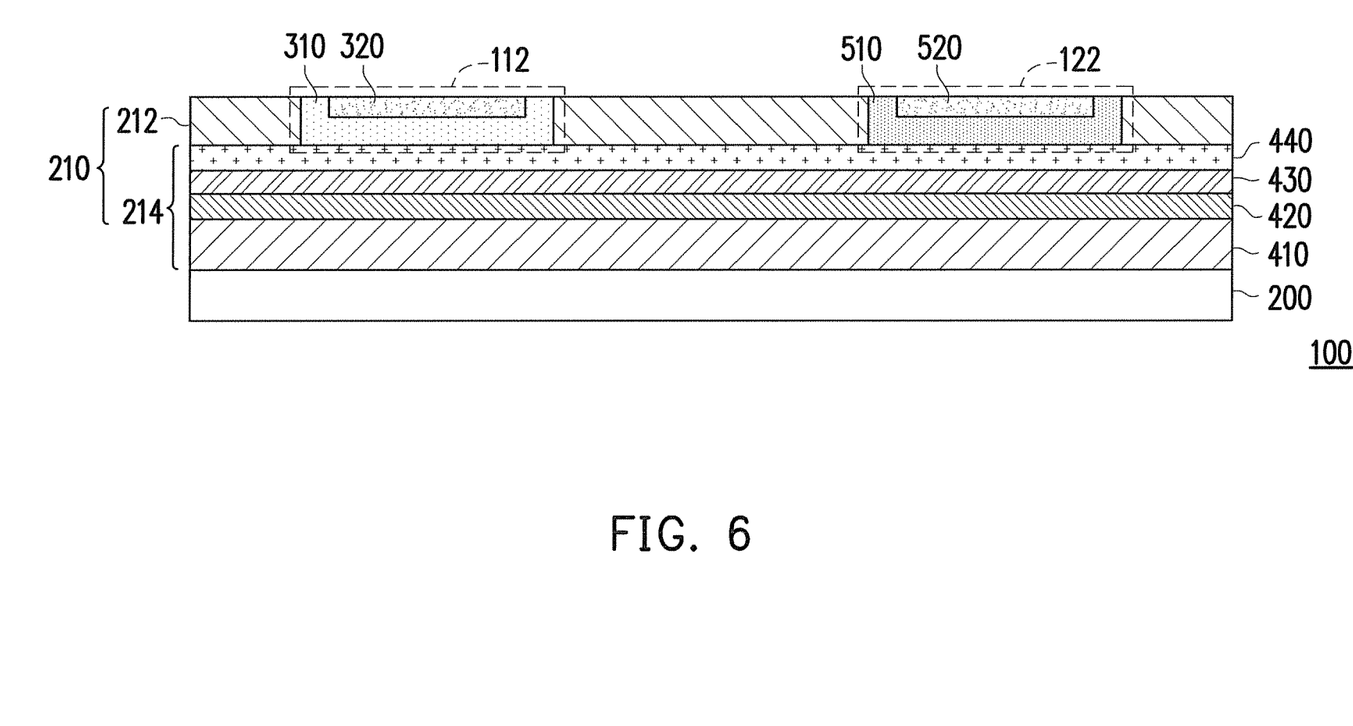

FIG. 5 and FIG. 6 show an etched area for the second memory function block, depositing another resistance change memory stack for the second memory function, and planarization. In FIG. 5 and FIG. 6, an area is etched in the dielectric layer 212, and a second resistance change memory stack 122 is deposited to the etched area. In the present embodiment, the second resistance change memory stack 122 includes a second phase change material layer 510 and a top electrode layer 520. The second phase change material layer 510 and the top electrode layer 520 are sequentially formed on the dielectric layer 212. Next, the second phase change material layer 510 and the top electrode layer 520 outside of the etched area are removed to planarize the dielectric layer 212. The second resistance change memory stack 122 in the dielectric layer 212 are formed for the second resistance change memory element 120. Two masks are used so far. The crosspoint fabrication flow follows, which uses an X-line mask and a Y-line mask.

In the present embodiment, at least two phase-change chalcogenide compositions are utilized, and possibly a third (without phase-change) for threshold switching. The material of the switch layer 430 may be GeTe6, for example, but the invention is not limited thereto. For the etching of the different compositions it is preferred to use Cl chemistry since it demonstrates the fastest etch for the Sb-rich high-speed and Ge-dominant storage composition. However a more fluorine-based chemistry may be added to etch the Te-rich selector composition, which is common to both the high-speed and storage crosspoint memory blocks anyway.

Figure 7A:
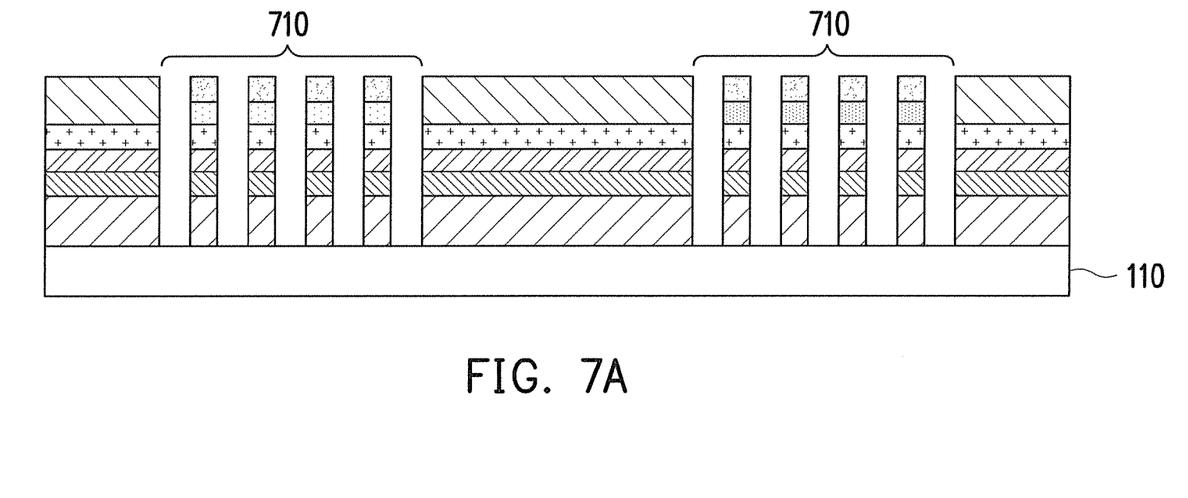
Figure 7B:
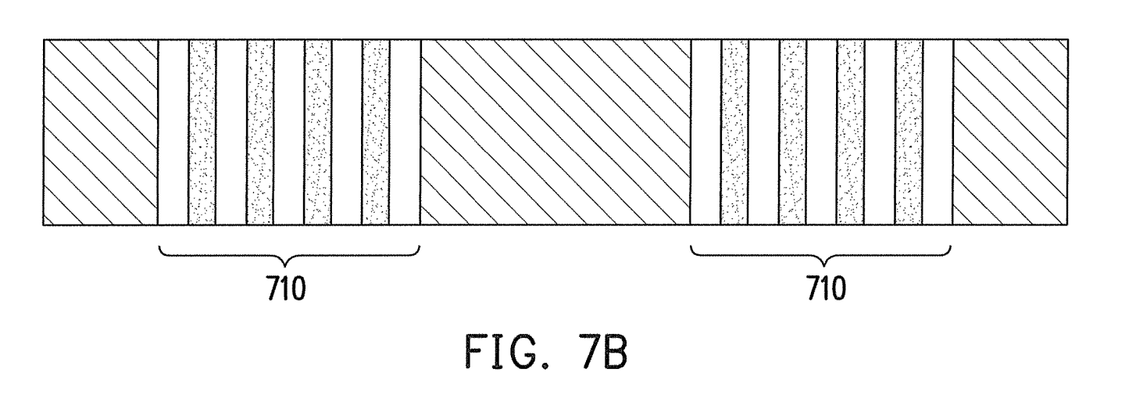
Figure 8A:
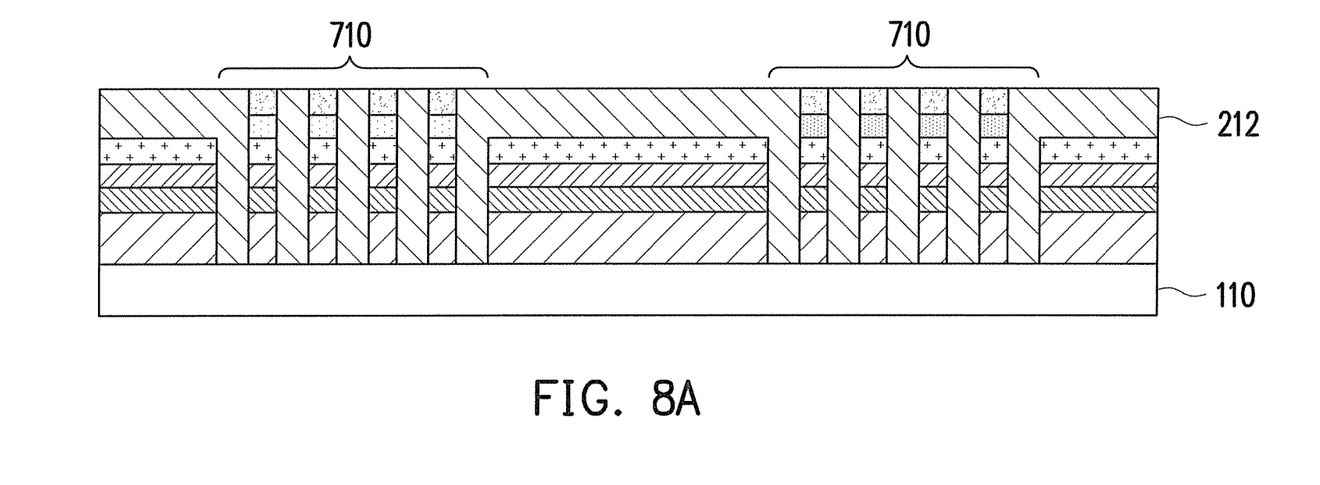
Figure 8B:
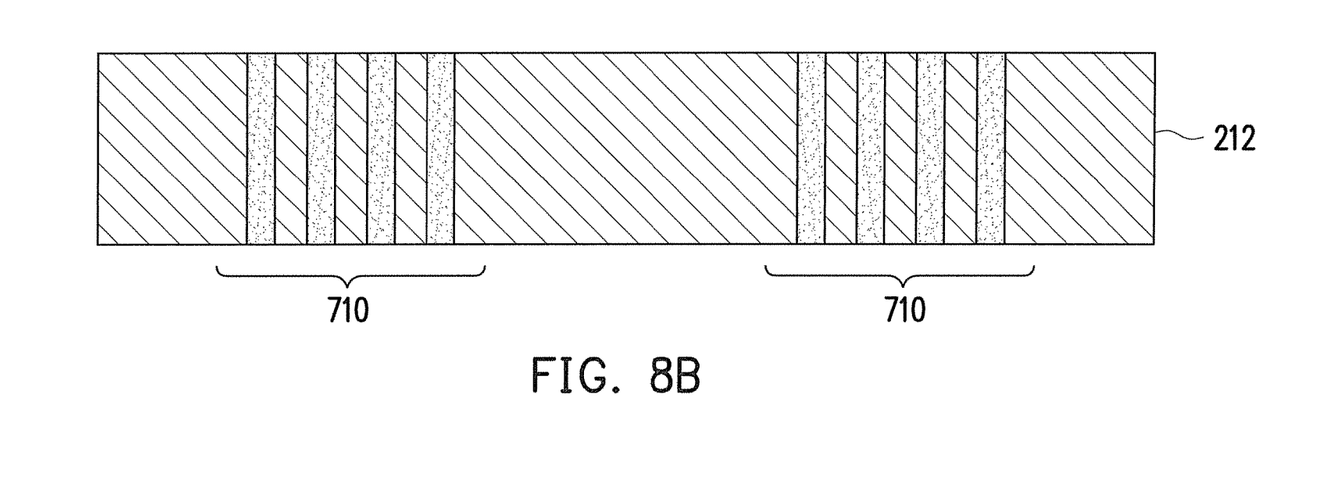

FIG. 7A schematically shows an etch word line pattern in a specific direction, e.g. the Y direction. FIG. 7B illustrates the fabricating process of the resistance change memory device depicted in FIG. 7A. FIG. 8A schematically shows dielectric backfill and planarization. FIG. 8B illustrates the fabricating process of the resistance change memory device depicted in FIG. 8A. Referring to FIG. 7A to FIG. 8B, the wording pattern 710 is formed, so that a space is generated between the wording pattern 710. Next, the dielectric material is backfilled to the space between the wording pattern 710, and the dielectric layer 212 is further planarized.

Figure 9A:
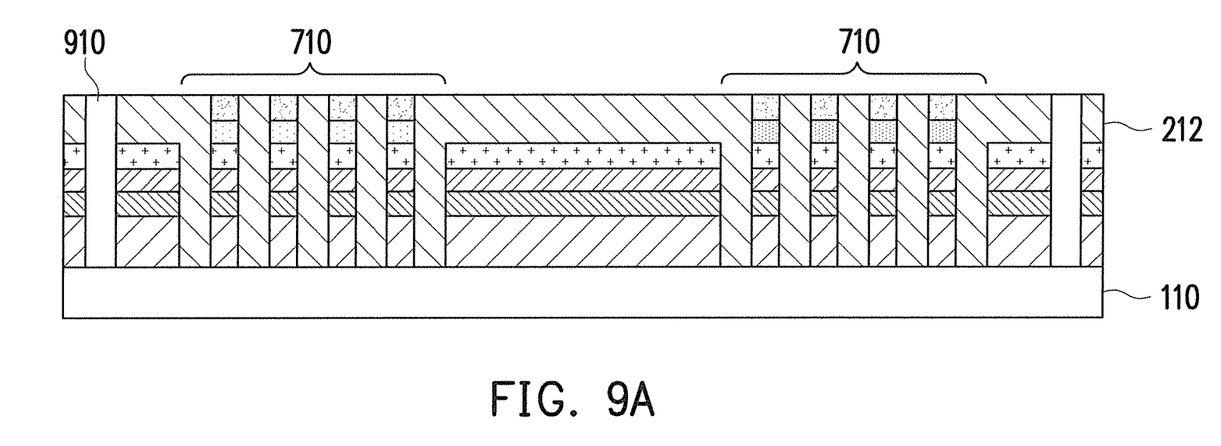
Figure 9B:
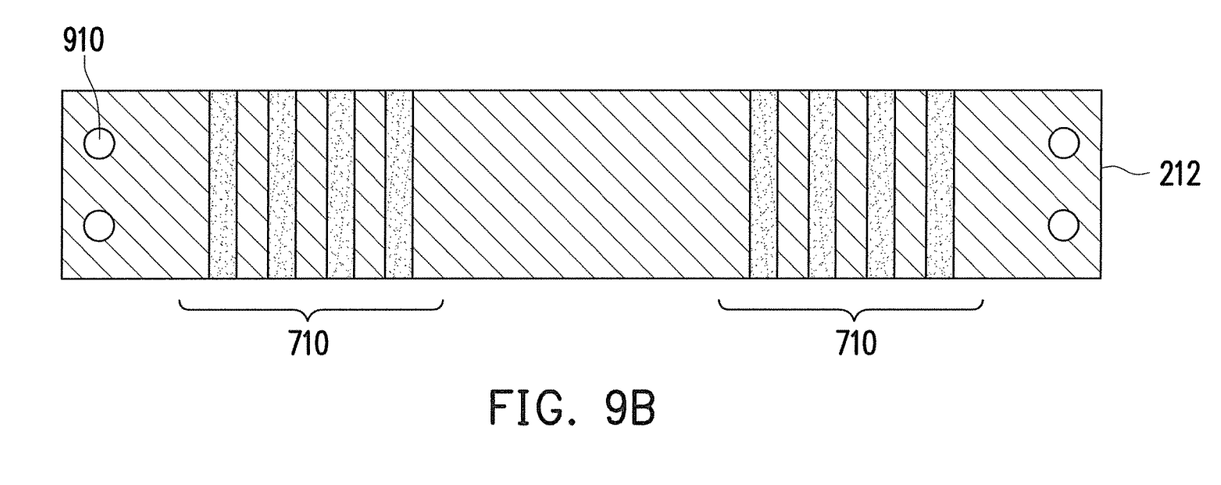
Figure 10A:
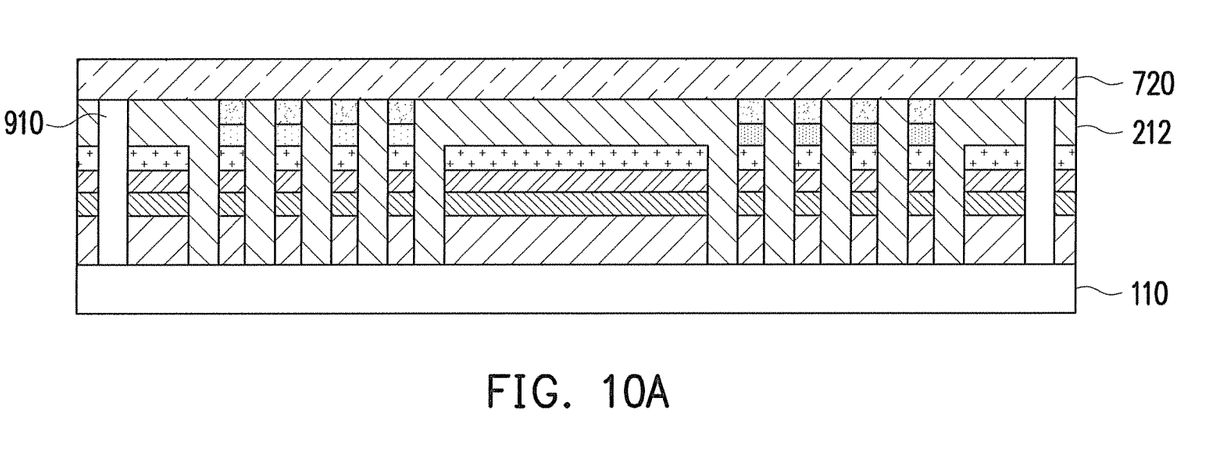
Figure 10B:
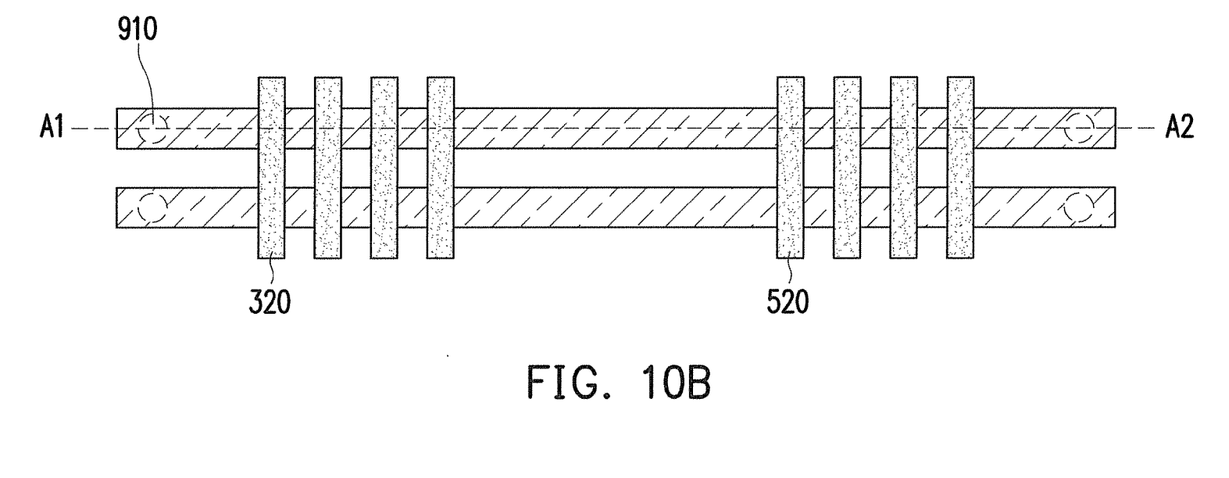
Figure 11A:
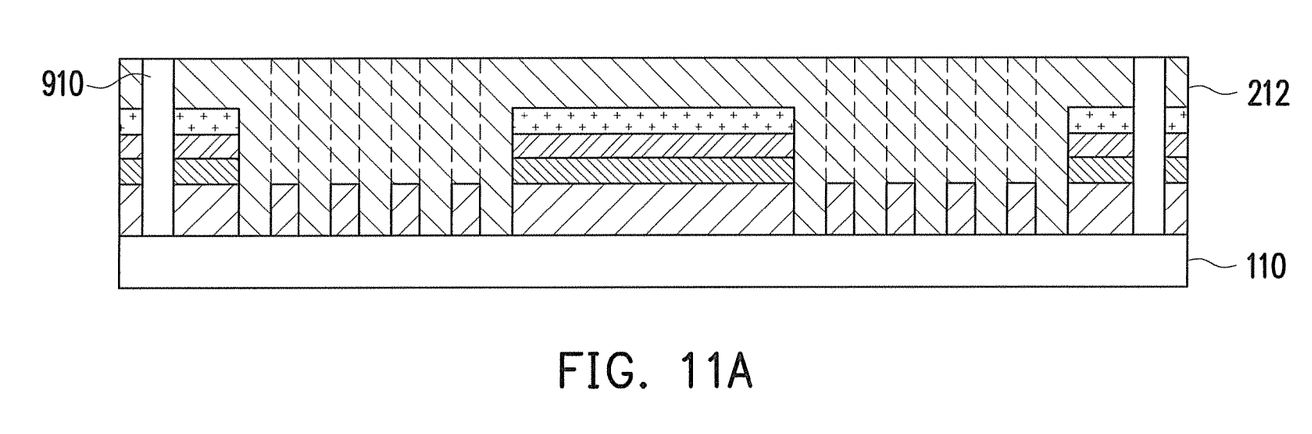
Figure 11B:
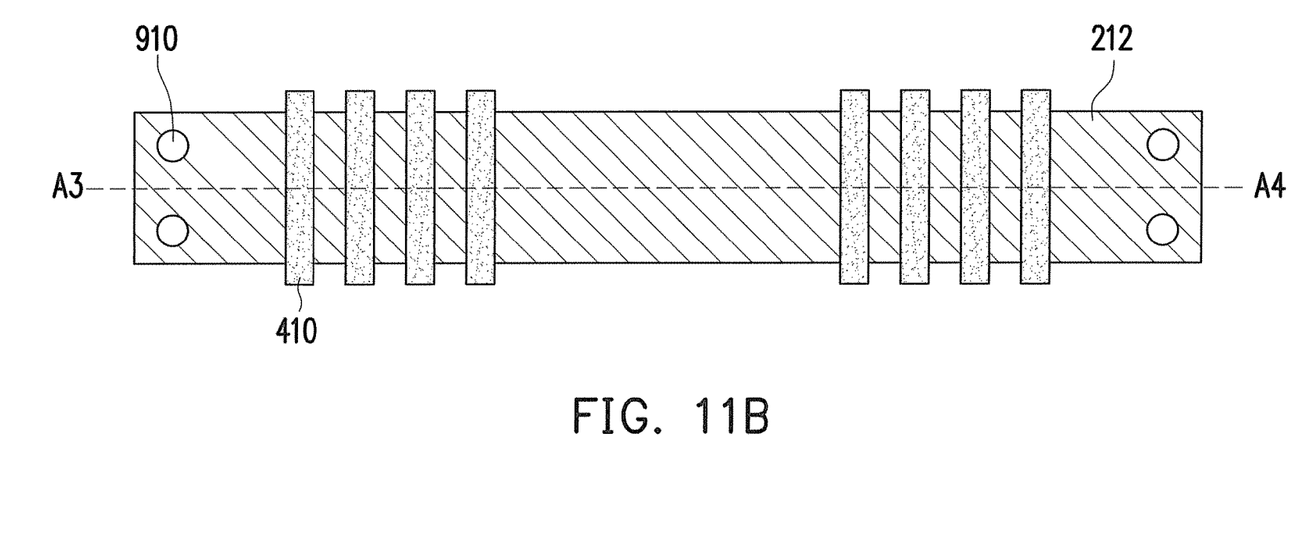

FIG. 9A schematically shows that bit line contacts are etched. FIG. 9B illustrates the fabricating process of the resistance change memory device depicted in FIG. 9A. FIG. 10A is a cross-sectional view along the line A1-A2 depicted in FIG. 10B, and schematically shows that the bit line pattern is etched. FIG. 10B illustrates the fabricating process of the resistance change memory device depicted in FIG. 10A. FIG. 11A is a cross-sectional view along the line A3-A4 depicted in FIG. 11B, and schematically shows the pattern between the bit lines. FIG. 11B illustrates the fabricating process of the resistance change memory device depicted in FIG. 11A. Referring to FIG. 9A to FIG. 11B, bit line contacts 910 are formed on the substrate 200, where the bit line contacts 910 pass through the starting layers 210. Next, the bit line pattern 720 on the dielectric layer 212 is formed, where the bit line pattern 212 contacts the bit line contacts 910. In FIG. 11A, the etched-out areas marked by the dotted lines may be backfilled by dielectric materials again.

In summary, in the exemplary embodiment of the invention, one part of the resistance change memory used for high-speed operation, where retention is not important, and the other part for storage, not requiring such high speed operation. A cost advantage is expected to be realized since although 5 back end of line (BEOL) masks, e.g. high-speed block, storage block, word lines, bit line contact, bit lines are added with processing, the Flash and DRAM array FEOL steps (>10 masks with processing) are no longer needed. Additionally, the periphery CMOS front-end-of-lines (FEOL) are fabricated under the crosspoint array, further saving chip area.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A fabrication method of a resistance change memory device, comprising:
    forming starting layers on a substrate, wherein the starting layers comprise a dielectric layer;
    forming a first resistance change memory stack in the dielectric layer for a first resistance change memory element, wherein the step of forming the first resistance change memory stack in the dielectric layer for the first resistance change memory element comprises:
        etching an area in the dielectric layer;
        depositing the first resistance change memory stack to the area; and
        planarizing the dielectric layer; and
    forming a second resistance change memory stack in the dielectric layer for a second resistance change memory element,
    wherein an accessing frequency of the first resistance change memory element is different from an accessing frequency of the second resistance change memory element,
    wherein the first resistance change memory stack comprises a first phase change material, the second resistance change memory stack comprises a second phase change material, and the accessing frequency of the first phase change material is different from the accessing frequency of the second phase change material.
2. The fabrication method of the resistance change memory device according to claim 1, wherein the accessing frequency of the first resistance change memory element is higher than the accessing frequency of the second resistance change memory element.

3. The fabrication method of the resistance change memory device according to claim 1, wherein the first phase change material is different from the second phase change material.

4. The fabrication method of the resistance change memory device according to claim 3, wherein a crystallization speed of the first phase change material is faster than a crystallization speed of the second phase change material.

5. The fabrication method of the resistance change memory device according to claim 3, wherein the first phase change material is Ge-rich GeSbTe (GST) material, and the second phase change material is a SbTe-based material.

6. The fabrication method of the resistance change memory device according to claim 1, wherein the first resistance change memory element and the second resistance change memory element are on the same chip.

7. The fabrication method of the resistance change memory device according to claim 1, wherein the first resistance change memory stack comprises a first phase change material layer and a top electrode layer, and the step of depositing the first resistance change memory stack to the area comprises:
 sequentially forming the first phase change material layer and the top electrode layer on the dielectric layer.

8. The fabrication method of the resistance change memory device according to claim 1, wherein the step of forming the second resistance change memory stack in the dielectric layer for the second resistance change memory element comprises:
 etching another area in the dielectric layer;
 depositing the second resistance change memory stack to the another area; and
 planarizing the dielectric layer.

9. The fabrication method of the resistance change memory device according to claim 8, wherein the second resistance change memory stack comprises a second phase change material layer and a top electrode layer, and the step of depositing the second resistance change memory stack to the another area comprises:
 sequentially forming the second phase change material layer and the top electrode layer on the dielectric layer.

10. The fabrication method of the resistance change memory device according to claim 1, wherein the starting layers further comprise a word line layer, a bottom electrode layer, a switch layer, and a middle electrode layer, and the step of forming the starting layers on the substrate comprises:
 sequentially forming the word line layer, the bottom electrode layer, the switch layer, the middle electrode layer, and the dielectric layer on the substrate.

11. The fabrication method of the resistance change memory device according to claim 10, further comprising:
 forming a wording pattern;
 backfilling a dielectric material to a space between the wording pattern; and
 planarizing the dielectric layer.

12. The fabrication method of the resistance change memory device according to claim 1, further comprising:
 forming bit line contacts on the substrate, wherein the bit line contacts pass through the starting layers; and
 forming a bit line pattern on the dielectric layer, wherein the bit line pattern contacts the bit line contacts.

* * * * *